(12) United States Patent
Ochi et al.

(10) Patent No.: US 10,516,012 B2
(45) Date of Patent: Dec. 24, 2019

(54) ELECTRO-OPTICAL DEVICE AND MANUFACTURING METHOD THEREOF

(71) Applicant: Sharp Kabushiki Kaisha, Sakai, Osaka (JP)

(72) Inventors: Hisao Ochi, Sakai (JP); Tohru Senoo, Sakai (JP); Jumpei Takahashi, Sakai (JP); Takeshi Hirase, Sakai (JP); Tohru Sonoda, Sakai (JP); Takashi Ochi, Sakai (JP); Akihiro Matsui, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 16/467,632

(22) PCT Filed: Aug. 10, 2017

(86) PCT No.: PCT/JP2017/029052
§ 371 (c)(1),
(2) Date: Jun. 7, 2019

(87) PCT Pub. No.: WO2019/030887
PCT Pub. Date: Feb. 14, 2019

(65) Prior Publication Data
US 2019/0326375 A1     Oct. 24, 2019

(51) Int. Cl.
*H01L 51/00* (2006.01)
*H01L 27/32* (2006.01)
(Continued)

(52) U.S. Cl.
CPC ............ *H01L 27/3246* (2013.01); *G09F 9/30* (2013.01); *H01L 51/5012* (2013.01);
(Continued)

(58) Field of Classification Search
CPC ............... H01L 27/3246; H01L 51/524; H01L 51/5253; H01L 51/5246
See application file for complete search history.

(56) References Cited

U.S. PATENT DOCUMENTS

| 7,524,228 B2 * | 4/2009 | Imamura | H05B 33/04 313/500 |
| 7,928,656 B2 * | 4/2011 | Imamura | H05B 33/04 313/504 |

(Continued)

FOREIGN PATENT DOCUMENTS

| JP | 2001100190 A | * | 4/2001 |
| JP | 2008-235089 A | | 10/2008 |

(Continued)

OTHER PUBLICATIONS

Official Communication issued in International Patent Application No. PCT/JP2017/029052, dated Nov. 14, 2017.

*Primary Examiner* — Nicholas J Tobergte
(74) *Attorney, Agent, or Firm* — Keating & Bennett, LLP

(57) ABSTRACT

An electro-optical device includes a circuit substrate including a flattening layer provided on a surface of the circuit substrate, at least one electro-optical element provided on the flattening layer, a sealing film configured to seal the electro-optical element and including at least a resin layer, and a frame-shaped bank surrounding the flattening layer and covered by the resin layer on an inner side of the frame-shaped bank. In a plan view, an unevenness is provided at a peripheral edge of the flattening layer facing the frame-shaped bank.

16 Claims, 12 Drawing Sheets

(51) Int. Cl.
  *G09F 9/30* (2006.01)
  *H05B 33/04* (2006.01)
  *H05B 33/10* (2006.01)
  *H01L 51/50* (2006.01)
  *H01L 51/52* (2006.01)
  *H05B 33/22* (2006.01)

(52) U.S. Cl.
  CPC ...... *H01L 51/5246* (2013.01); *H01L 51/5253* (2013.01); *H05B 33/04* (2013.01); *H05B 33/10* (2013.01); *H05B 33/22* (2013.01); *H01L 51/524* (2013.01); *H01L 2251/5338* (2013.01)

(56)        References Cited

U.S. PATENT DOCUMENTS

| | | | |
|---|---|---|---|
| 2003/0164674 | A1 | 9/2003 | Imamura |
| 2005/0269940 | A1* | 12/2005 | Nishikawa .......... H01L 51/5243 313/500 |
| 2006/0270305 | A1* | 11/2006 | Imamura ................ H05B 33/04 445/25 |
| 2009/0179566 | A1* | 7/2009 | Imamura ................ H05B 33/04 313/512 |
| 2017/0194599 | A1 | 7/2017 | Furuie |

FOREIGN PATENT DOCUMENTS

| | | |
|---|---|---|
| JP | 2009-129605 A | 6/2009 |
| JP | 2011-146323 A | 7/2011 |
| JP | 2012-253036 A | 12/2012 |
| JP | 2017-123257 A | 7/2017 |

* cited by examiner

ELECTRO-OPTICAL DEVICE AND MANUFACTURING METHOD THEREOF

TECHNICAL FIELD

The disclosure relates to an electro-optical device and a manufacturing method thereof.

BACKGROUND ART

Electro-optical elements such as electroluminescence (hereinafter, referred to as "EL") elements are in general easily effected by moisture, oxygen, and the like. When the electro-optical elements react with a small amount of moisture or oxygen, properties of the electro-optical elements deteriorate and eventually, problems such as a reduction in reliability and a reduced lifetime of the obtained device occur.

As a method for preventing the infiltration of moisture or oxygen into electro-optical elements, a method is known in which electro-optical elements are sealed by a sealing film including a resin layer. However, the resin is a liquid and thus has a property due to which wet-spreading can occur.

Here, when the resin layer is formed by using an ink-jet method or the like, for example, PTL 1 discloses a restriction of wet-spreading of the resin for sealing the electro-optical elements, by forming a plurality of frame-shaped banks surrounding a flattening layer in which the electro-optical elements are provided.

CITATION LIST

Patent Literature

PTL 1: JP 2011-146323 A (published on Jul. 28, 2011).

SUMMARY

Technical Problem

When the resin (for example, an ink material) dropped on the flattening layer by an ink-jet method or the like once runs off from the flattening layer, wet-spreading of the resin easily occurs. However, on the other hand, due to the surface tension, a flow movement of the resin is easily stopped on an upper face of a flattening layer, and the resin does not run off from the upper face of the flattening layer. Thus, there are cases where the resin does not reach frame-shaped banks.

However, when the resin stops on the flattening layer and does not reach the frame-shaped banks, a region is formed where foreign matters cannot be covered and levelled by the resin layer, when foreign matters infiltrate between the flattening layer and the frame-shaped banks. As a result, when moisture or the like permeates from the region into the resin layer, there is a concern in that the reliability of the device is reduced due to deterioration of the electro-optical elements in an active region, the occurrence of shrinking, and the like.

The disclosure has been contrived in view of the problem and an object thereof is to provide an electro-optical device capable of preventing a reduction in the reliability as a result of insufficient covering of foreign matters; and a manufacturing method of the electro-optical device.

Solution to Problem

To solve the problem, an electro-optical device according to one aspect of the disclosure includes a circuit substrate including a flattening layer provided on a surface of the circuit substrate, at least one electro-optical element provided on the flattening layer, a sealing film sealing the electro-optical element and including at least a resin layer, and a frame-shaped bank surrounding the flattening layer and covered by the resin layer on an inner side of the frame-shaped bank, and, in a plan view, an unevenness is provided at a peripheral edge of the flattening layer facing the frame-shaped bank.

To solve the problem, a manufacturing method of an electro-optical device according to one aspect of the disclosure is a manufacturing method of an electro-optical device including a circuit substrate including a flattening layer provided on a surface of the circuit substrate, at least one electro-optical element provided on the flattening layer, a sealing film sealing the electro-optical element and including at least a resin layer, and a frame-shaped bank surrounding the flattening layer and covered by the resin layer on an inner side of the frame-shaped bank, the manufacturing method including forming an unevenness in a plan view at a peripheral edge of the flattening layer, forming the frame-shaped bank surrounding the flattening layer, and forming the resin layer covering an inner side of the frame-shaped bank, and the forming the resin layer includes dropping a liquid resin on the flattening layer.

Advantageous Effects of Invention

According to one aspect of the disclosure, the resin used in the resin layer easily runs off downward from the flattening layer. Thus, the resin easily reaches the frame-shaped banks, and the inner side of the frame-shaped banks can be easily covered by the resin layer. Therefore, it is possible to provide an electro-optical device capable of preventing a reduction in reliability as a result of insufficient covering of foreign matters; and a manufacturing method of the electro-optical device.

BRIEF DESCRIPTION OF DRAWINGS

FIG. 8B is a cross-sectional view along arrows on a line B-B in the electro-optical device illustrated in FIG. 8A.

DESCRIPTION OF EMBODIMENTS

First Embodiment

Figure 1:
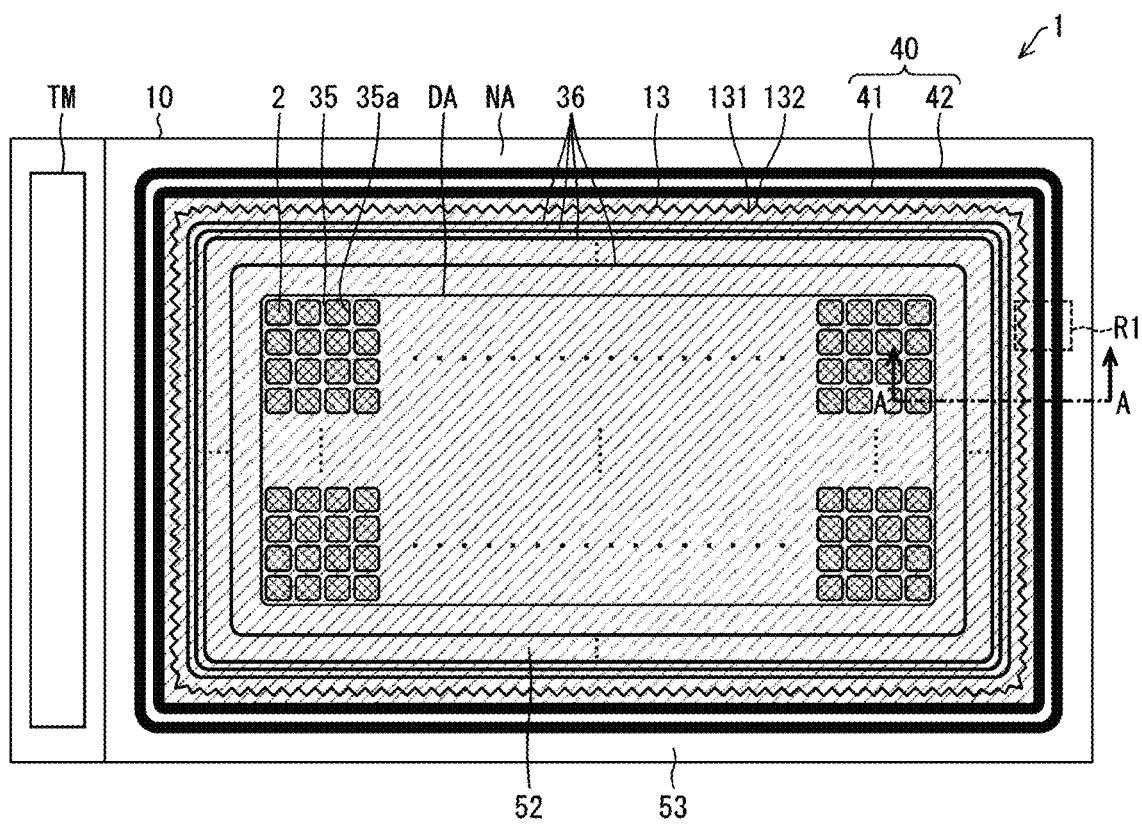
FIG. 1 is a plan view illustrating a schematic configuration of main portions of an electro-optical device according to a first embodiment of the disclosure.
Figure 2:
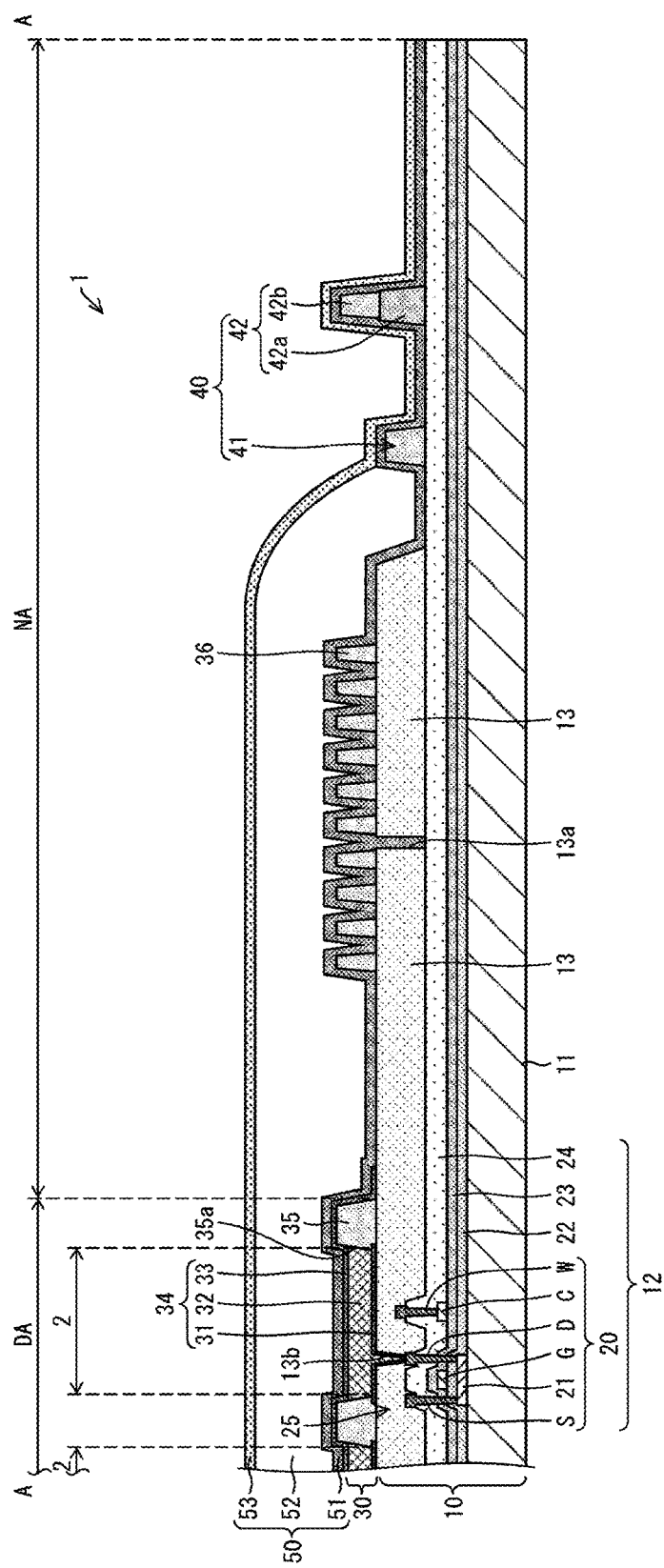
FIG. 2 is a cross-sectional view illustrating a schematic configuration of main portions of the electro-optical device according to the first embodiment of the disclosure.

A description follows regarding one aspect of the disclosure, with reference to FIGS. 1 to 8A and 8B.
Schematic Configuration of Electro-Optical Device FIG. 1 is a plan view schematically illustrating a schematic configuration of main portions of an electro-optical device 1 according to the present embodiment. FIG. 2 is a cross-sectional view illustrating a schematic configuration of main portions of the electro-optical device 1 according to the present embodiment.

Note that FIG. 2 corresponds to a cross-sectional view along arrows on a line A-A in the electro-optical device 1 illustrated in FIG. 1.

FIG. 2 illustrates an example of a case in which the electro-optical device 1 according to the present embodiment is an organic EL display device including, as electro-optical elements, Organic Light Emitting Diode (OLED) elements 34 referred to as organic EL elements.

The electro-optical device 1 according to the present embodiment may be a bendable, flexible device or may be a non-bendable, rigid device.

As illustrated in FIG. 2, the electro-optical device 1 according to the present embodiment includes a circuit substrate 10 (support body), an OLED element layer 30 (OLED element portion, electro-optical element layer) including the OLED elements 34 (electro-optical elements), a dam portion 40, and a sealing film 50 provided on the circuit substrate 10. Note that, for example, a cover body (not illustrated) may be provided on the sealing film 50 with an adhesive layer (not illustrated) interposed between the sealing film 50 and the cover body.
Circuit Substrate 10

The circuit substrate 10 includes an insulating substrate 11 (base layer) having insulating properties, a TFT layer 12 (driving element layer, driving element portion) provided on the insulating substrate 11, and a flattening layer 13 (interlayer insulating film) provided on the TFT layer 12.

The insulating substrate 11 may be, for example, a layered film having flexibility in which a lower face film, a resin layer, and a barrier layer, all of which are not illustrated in the drawing, are provided in this order, and the insulating substrate 11 may be a glass substrate, a plastic substrate, or a plastic film.

The TFT layer 12 is a circuit layer including a circuit portion 20 in which a TFT 25 (driving element) for driving the OLED elements 34 and a plurality of wiring lines (not illustrated) are formed; and inorganic insulating layers 22, 23, and 24 for protecting each wiring line in the circuit portion 20 and each electrode (gate electrode G, source electrode S, drain electrode D) in the TFT 25.

The wiring lines include, for example, wiring lines such as a plurality of gate wiring lines, a plurality of source wiring lines, a plurality of capacitance wiring lines, and a plurality of second electrode connecting wiring lines. The inorganic insulating layers 22, 23, and 24 are formed to cover the entirety of one face of the insulating substrate, for example.

The TFT layer 12 has a configuration in which a semiconductor layer 21 formed in the shape of a plurality of islands, the inorganic insulating layer 22 (gate insulating film), a first wiring line layer, the inorganic insulating layer 23 (first passivation film), a second wiring line layer, the inorganic insulating layer 24 (second passivation film), and a third wiring line layer are layered in this order. A terminal portion TM (refer to FIG. 1) including a plurality of terminals (terminal electrodes) for external connection is provided in an end portion of the TFT layer 12.

The first wiring line layer includes, for example, a plurality of gate electrodes G, a plurality of gate wiring lines (not illustrated) connected to the plurality of gate electrodes G, and the like. The second wiring line layer includes, for example, a plurality of capacitance wiring lines. The third wiring line layer includes, for example, a plurality of source electrodes S, a plurality of source wiring lines (not illustrated) connected to the plurality of source electrodes S a plurality of drain electrodes D, the plurality of second electrode connecting wiring lines (not illustrated) connected to second electrodes 33 of the OLED elements 34, and the like. The gate wiring line and the source wiring line are intersected orthogonal to each other in a plan view.

Regions surrounded in a lattice pattern by the gate wiring line and the source wiring line are pixels 2, and a single picture element is formed by a set of the pixels 2 of each color. The TFT 25 is provided for each of the pixels 2. The TFT 25 includes the semiconductor layer 21, the gate electrode G, the inorganic insulating layer 22, the source electrode S, and the drain electrode D. Note that FIG. 2 illustrates an example of a case in which the TFT 25 has a top gate structure. However, the TFT 25 may have a bottom gate structure.

The flattening layer 13 is provided on the TFT layer 12 so as to cover the circuit portion 20. As a result, the flattening layer 13 levels a step on the TFT 25 and the third wiring line layer.

As illustrated in FIG. 1 and FIG. 2, the circuit portion 20 and the flattening layer 13 are provided from an active region DA to a non-active area NA. The active region DA is a region where the OLED elements 34 are provided (a region surrounded by a bank 35), and in the present embodiment, the active region DA is a pixel area (display region) where a plurality of the pixels 2 are provided. The non-active area NA is a peripheral region (frame region) surrounding a periphery of the active region DA.

In the flattening layer 13, a slit 13a is formed, in the non-active area NA, into a frame shape in a plan view so as to surround the active region, for preventing the infiltration of moisture to the TFT 25 and the OLED elements 34 in the active region DA. In this way, the flattening layer 13 is partitioned to block a permeation path of the moisture, and thus the reliability of the electro-optical device 1 can be improved.

Note that a shape of an edge of the flattening layer 13 will be described later.

As illustrated in FIG. 1, the terminal portion TM is provided in a part of the non-active area NA. The gate wiring lines and the source wiring lines are each connected via lead wiring lines (not-illustrated) to terminals (not-illustrated) in the terminal portion TM. The lead wiring lines, a second electrode connecting portion (not illustrated) connecting the second electrode connecting wiring line with the second electrode 33 extending from the active region DA, and the like are provided in the non-active area NA. Note that the source wiring line may be used as the second electrode connecting wiring line.

The semiconductor layer 21 is formed of, for example, low temperature polysilicon (LTPS) or an oxide semiconductor. The inorganic insulating layer 22 can be configured by a silicon oxide (SiOx) film or a silicon nitride (SiNx) film; or a layered film of these, formed by using CVD, for example. The first wiring line layer, the second wiring line layer, the third wiring line layer, and the terminal portion TM are composed of a single-layer film or a layered film of a metal such as aluminum (Al), tungsten (W), molybdenum (Mo), tantalum (Ta), chromium (Cr), titanium (Ti), and copper (Cu), for example. The flattening layer 13 can be configured by a photosensitive resin such as polyimide resin and acrylic resin, for example.

OLED Element Layer 30

The OLED element layer 30 is provided on the flattening layer 13. The OLED element layer 30 includes a first electrode 31 (lower electrode), an organic EL layer 32 (function layer) formed on the first electrode 31 and formed from an organic layer including at least a light emitting layer, the second electrode 33 (upper electrode) formed on the organic EL layer 32, and banks 35 and 36.

The first electrode 31, the organic EL layer 32, and the second electrode 33 constitute the OLED elements 34 (light emitting elements) constituting each of the pixels 2. Layers between the first electrode 31 and the second electrode 33 are collectively referred to as the organic EL layer 32 in the present embodiment.

The first electrode 31 is formed on the flattening layer 13 in the active region DA. The first electrode 31 injects (supplies) holes into the organic EL layer 32, while the second electrode 33 injects electrons into the organic EL layer 32.

The first electrode 31 is a pattern electrode (for example, a pattern anode) formed into an island-shaped pattern for each of the pixels 2. Meanwhile, the second electrode 33 is a solid-like common electrode (for example, a common cathode) provided in common for each of the pixels 2.

The first electrode 31 is electrically connected to each TFT 25 via a contact hole 13b formed in the flattening layer 13 in each of the pixels 2. The second electrode 33 is electrically connected to the second electrode connecting wiring line in the second electrode connecting portion.

The bank 35 is formed on the flattening layer 13 in the active region DA. The banks 36 are formed on the flattening layer 13 in the non-active area NA.

The bank 35 is provided, for example, in a lattice pattern in a plan view to cover a peripheral portion (that is, each edge portion) of the first electrode 31 and to include an opening 35a exposing a part of the first electrode 31. The bank 35 functions as an edge cover preventing a short-circuit with the second electrode 33 due to a concentration of electrodes or a thinning of the organic EL layer 32 at the peripheral portion of the first electrode 31. The opening 35a of the bank 35 is the light emitting region of each of the pixels 2. Furthermore, the bank 35 also functions as an element separation layer (pixel separation layer) separating the OLED elements 34 so that electric current does not leak into adjacent OLED elements 34 (pixels 2).

The banks 36 are each formed into a frame shape so as to surround the active region DA. The banks 36 function as resistance when an ink material 152 (refer to FIG. 5D and FIG. 6, liquid resin, inkjet material) that is the material of a resin layer 52 passes the banks 36. During the film formation of the resin layer 52 in the sealing film 50, the banks 36 reduce the flow speed of the ink material 152 stepwise to prevent wet-spreading of the ink material 152.

Note that the banks 36 may be formed in a continuous frame shape or may be formed in an intermittent frame shape. Although not illustrated in the drawings, the banks 36 may be formed, for example, into a plurality of dot-shaped banks that are spaced from each other, and each of the dot-shaped banks may be arranged in a plurality of rows to form an intermittent frame shape. In this case, it is desirable that the banks 36 have a configuration in which the dot-shaped banks of adjacent rows are arranged in a zig-zag shape in a plan view.

Furthermore, the banks 36 function as spacers (support bodies) supporting a mask for vapor deposition used for the vapor deposition of layers formed in the active region DA (for example, the organic EL layer 32). The mask for vapor deposition is supported in a state of being spaced from the film-formed substrate so that the mask for vapor deposition does not come into contact with the surface of the film-formed substrate on which the film is formed.

A photosensitive resin can be used for the banks 35 and 36. A transparent conductive film, such as indium tin oxide (ITO) and indium zinc oxide (IZO), or a thin film of a metal, such as gold (Au), platinum (Pt), and nickel (Ni), can be used as the first electrode 31, for example. To inject electrons into the light emitting layer, a metal with a small work function, such as lithium (Li), cerium (Ce), barium (Ba), and aluminum (Al), or an alloy containing these metals, such as a magnesium alloy (MgAg or the like) and an aluminum alloy (AlLi, AlCa, AlMg, or the like), can be used as the second electrode 33.

Dam Portion 40

The dam portion 40 is provided in the non-active area NA so as to surround the flattening layer 13 in which the OLED elements 34 are provided. The dam portion 40 is a dam portion (ink material stopper) configured to stop the ink material 152 used for the resin layer 52 in the sealing film 50 to stop a flow movement of the ink material 152.

The dam portion 40 includes a frame-shaped first bank 41 and a frame-shaped second bank 42 arranged in a double-frame shape. The first bank 41 is provided outside of the flattening layer 13, facing the flattening layer 13, to surround the flattening layer 13 in which the OLED elements 34 are provided. The second bank 42 is provided outside of the first bank 41, surrounding the first bank 41.

The first bank 41 and the second bank 42 each have a frame shape formed by a continuous line. An inner side of the first bank 41 is covered by the resin layer 52. A peripheral portion of the resin layer 52 is in contact with the first bank 41. An edge of the resin layer 52 is defined by the first bank 41.

The second bank 42 is shaped so that the height of the second bank 42 is higher than the height of the first bank 41. Here, the height of the second bank 42 refers to a height from an upper face of the circuit substrate 10 (in other words, a surface of an underlayer on which the first bank 41 and the second bank 42 are provided; in the example illustrated in FIG. 2, a surface of the inorganic insulating layer 24) to an upper face of the second bank 42. Furthermore, the height of the first bank 41 refers to a height from an upper face of the circuit substrate 10 to an upper face of the first bank 41.

A material of the first bank 41 and the second bank 42 is not particularly limited, however, the same material as for the flattening layer 13 or the banks 35 and 36 can be used, for example. As a result, the first bank 41 and the second bank 42 can be formed simultaneously with the flattening layer 13 or the banks 35 and 36.

In the example illustrated in FIG. 2, a bank formed from the same material as the banks 35 and 36 is formed as the first bank 41. Furthermore, as the second bank 42, a two-stepped bank is formed by layering an upper layer bank 42b formed from the same material as the banks 35 and 36 on a lower layer bank 42a formed from the same material as the flattening layer 13.

Note that, the banks (that is, the banks 35 and 36, the first bank 41, and the second bank 42) and an end face of the flattening layer 13 preferably have a forwardly tapered shape, to obtain good covering of a formation surface where each of the banks and the end face of the flattening layer 13 is formed, for example. Thus, a positive-working photosensitive resin such as an acrylic resin and a polyimide resin, for example, can be suitably used for the banks and the flattening layer 13.

Furthermore, in FIG. 1 and FIG. 2, an example of a case is illustrated in which the first bank 41 and the second bank 42 surround the active region DA as a double-structure. However, the dam portion 40 may further include at least one frame-shaped bank outside of the second bank 42 and may surround the active region DA as a threefold or higher structure.

Sealing Film 50

The sealing film 50 includes the resin layer 52, and a first inorganic layer 51 and a second inorganic layer 53 sandwiching the resin layer 52. The first inorganic layer 51 and the second inorganic layer 53 are provided superposed with each other in a plan view so as to seal the resin layer 52 in between.

The first inorganic layer 51 and the second inorganic layer 53 have a moisture-proof function to inhibit the infiltration of moisture, and the first inorganic layer 51 and the second inorganic layer 53 function as barrier layers to inhibit deterioration of the electro-optical elements (the OLED elements 34 in the example illustrated in FIG. 1) by moisture or oxygen.

The resin layer 52 is used as a buffer layer (a stress relief layer). The resin layer 52 performs stress relief of the first inorganic layer 51 and the second inorganic layer 53 having a large film stress, and levelling and filling of pin holes by filling a step portion and foreign matters on the surface of the OLED element layer 30 that is the electro-optical element layer. Furthermore, the resin layer 52 suppresses the occurrence of cracks on the second inorganic layer 53 during layering of the second inorganic layer 53 by levelling an underlayer of the second inorganic layer 53.

The first inorganic layer 51 and the second inorganic layer 53, for example, each can be configured by a silicon oxide film, a silicon nitride film, a silicon oxynitride film, or by a layered film of these films, each formed by CVD.

The resin layer 52 is thicker than the first inorganic layer 51 and the second inorganic layer 53, and the resin layer 52 is a light-transmitting organic insulating film. The resin layer 52 is formed, for example, by applying, by an ink-jet method or the like, the ink material 152 to within a region on the first inorganic layer 51 surrounded by the first bank 41; and by curing the ink material 152 by UV curing or the like. A photosensitive resin, such as an acrylic resin, an epoxy resin, or a silicone resin can be used as the resin, for example.

Note that, as described earlier, the cover body (not illustrated) may be provided on the sealing film 50 with the adhesive layer (not illustrated) interposed between the sealing film 50 and the cover body. The cover body is a function layer having at least one of a protection function, an optical compensation function, or a touch sensor function. The cover body may be a protection film functioning as a support body when a carrier substrate such as a glass substrate is peeled off, may be a hard coat layer such as a hard coat film, and may be a functional film such as a polarizing film and a touch sensor film.

Forming of Edge of Flattening Layer 13

Figure 3A:
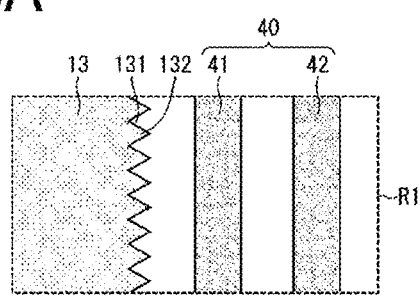
FIG. 3A is a plan view illustrating a schematic configuration of a region illustrated surrounded by a frame in FIG. 1 in an electro-optical device according to the first embodiment of the disclosure before the formation of a sealing film.
Figure 3B:
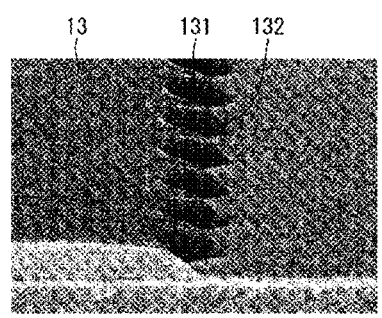
FIG. 3B is a perspective view illustrating a SEM image of an edge of a flattening layer in the region mentioned above.

FIG. 3A is a plan view illustrating a schematic configuration of a region R1 illustrated surrounded by a frame in FIG. 1 in the electro-optical device 1 before forming of the sealing film. FIG. 3B is a perspective view illustrating a scanning electron microscope (SEM) image of an edge of the flattening layer 13 in the region R1.

As illustrated in FIG. 2 and FIGS. 3A and 3B, an uneven structure including recessed portions 131 and protruding portions 132 in a plan view is provided in an edge of the flattening layer 13, facing the first bank 41 surrounding the flattening layer 13. In other words, the uneven structure, including the recessed portions 131 recessed in a direction orthogonal to the film thickness (layer thickness) of the flattening layer 13 (that is, in an in-plane direction) and the protruding portions 132 protruding in the in-plane direction, is provided on the side of the flattening layer 13 facing the first bank 41 (that is, on each end face of the flattening layer 13). It is desirable that the uneven structure is provided over the entire peripheral portion of the flattening layer 13 (that is, over the entire circumference). Furthermore, it is desirable that the recessed portions 131 and the protruding portions 132 are provided regularly.

In FIG. 2 and FIGS. 3A and 3B, an example of a case is illustrated in which the uneven structure has a zig-zag shape (triangular wave shape) and each of the recessed portions 131 and the protruding portions 132 has triangular shape. However, the shape of the recessed portions 131 and the protruding portions 132, in other words, the shape of the uneven structure, is not particularly limited.

Figure 4A:
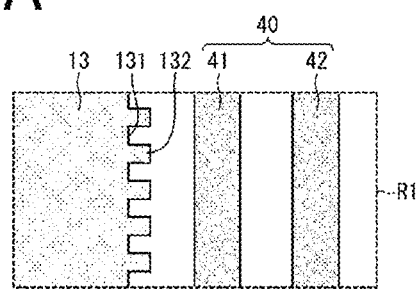
FIGS. 4A and 4B are plan views illustrating other examples of an uneven structure of the edge of the flattening layer in the electro-optical device according to the first embodiment of the disclosure.
Figure 4B:
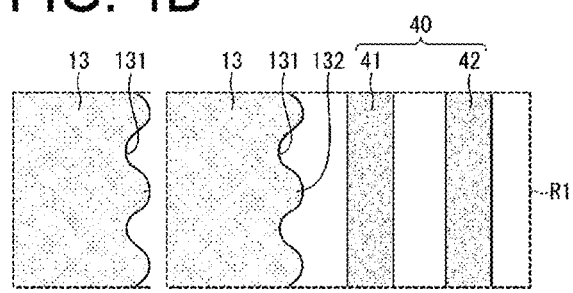

FIGS. 4A and 4B are plan views illustrating other examples of the uneven structure of the edge of the flattening layer 13 in the electro-optical device 1 according to the present embodiment.

As illustrated in FIG. 4A, the uneven structure may have a comb shape (rectangular wave shape) in which each of the recessed portions 131 and the protruding portions 132 has a rectangular shape. Furthermore, as illustrated in FIG. 4B, the uneven structure may have a wave shape (for example, a sine wave shape) in which each of the recessed portions 131 and the protruding portions 132 has a curved shape (circular arc shape). Furthermore, although not illustrated in the drawings, each of the recessed portions 131 and the protruding portions 132 may have a shape forming a triangular shape or a higher polygonal shape or a part thereof.

A taper angle of the recessed portions 131 in a plan view and a taper angle of the protruding portions 132 in a plan view are not particularly limited. Furthermore, a distance from a base of the recessed portions 131 to leading ends of the protruding portions 132 in a plan view (in other words, the depth of the recessed portions 131 in a plan view, the length of the protruding portions 132 in a plan view) is also not particularly limited. Furthermore, the width of the recessed portions 131 and the width of the protruding portions 132; and a pitch between adjacent recessed portions 131 and a pitch between adjacent protruding portions 132 in a plan view are also not particularly limited. Furthermore, a distance from the leading ends of the protruding portions 132 in a plan view or from the base of the recessed portions 131 in a plan view to the first bank 41 is also not particularly limited.

However, it is desirable that the distance from the leading ends of the protruding portions 132 to the first bank 41 in a plan view (in other words, the closest distance between the flattening layer 13 and the first bank 41) is not less than 4.5 µm, considering the pattern resolution of the flattening layer 13. However, when the closest distance between the flattening layer 13 and the first bank 41 becomes longer, the width of the non-active area NA becomes larger accordingly and the dimensions of the electro-optical device 1 become bigger. Thus, it is desirable that the closest distance between the flattening layer 13 and the first bank 41 is within a range of 100 µm or less, for example.

Furthermore, it is preferable that the end face of the flattening layer 13 has a forwardly tapered shape, as described above. The smaller an inclination angle is formed by the end face of the flattening layer 13 and a surface parallel to the surface of the circuit substrate 10, the easier the ink material 152 used for the resin layer 52 falls from the surface of the flattening layer 13. Thus, the inclination angle is preferably 40 degrees or less and more preferably 30 degrees or less, for example. The inclination angle (smallest inclination angle) is determined by a positional relationship of wiring lines of a gate driver (not illustrated) provided below the flattening layer 13 and an edge portion of the flattening layer 13.

Furthermore, in the present embodiment, as illustrated in FIG. 1, the active region DA of the electro-optical device 1 has a rectangular shape in which the four corners (each angle portion) are curved. Thus, outer shapes of the flattening layer 13, the banks 35 and 36, the first bank 41, and the second bank 42 are almost similarly shaped to an outer shape of the active region DA, and the four corners have a curved rectangular shape. Note that, when the active region DA has a triangular shape or a higher polygonal shape (each angle portion may be curved), the shapes of the flattening layer 13, the banks 35 and 36, the first bank 41, and the second bank 42 are almost similarly shaped to the outer shape of the active region DA, and each angle portion has a curved polygonal shape.

When each angle portion (the four corners in the example illustrated in FIG. 1) is curved in this way, a direct distance from the edge of the flattening layer 13 to an inner wall of the first bank 41 can be maintained constant over the entire peripheral portion of the flattening layer 13 (that is, over the entire circumference), for example. Similarly, a direct distance from the edge of the active region DA to the inner wall of the first bank 41 can be maintained constant over the entire peripheral portion of the active region DA.

However, the present embodiment is not limited thereto and each angle portion of the active region DA, the flattening layer 13, the banks 35 and 36, the first bank 41, and the second bank 42 may be shaped as a right angle. Furthermore, the outer shapes of the active region DA, the flattening layer 13, the banks 35 and 36, the first bank 41, and the second bank 42 may be shapes having at least one angle portion (for example, an irregular shape; or a triangular shape or a higher polygonal shape, having at least one angle portion).

Manufacturing Method of Electro-Optical Device 1

Next, a manufacturing method of the electro-optical device 1 will be described below by referring mainly to FIGS. 5A to 5E to FIG. 7B.

Figure 6:
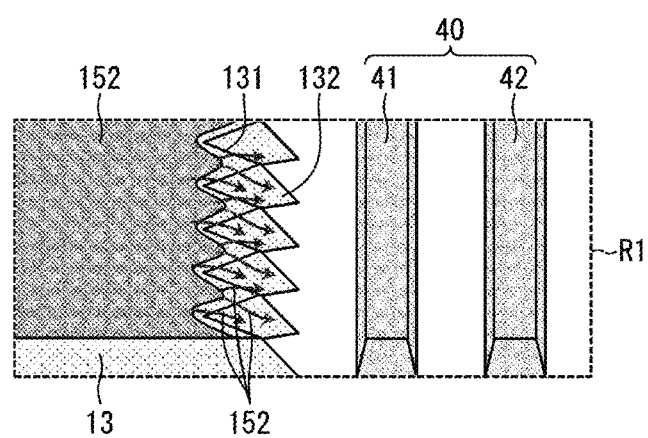
FIG. 6 is a perspective view illustrating a schematic configuration of a region illustrated surrounded by the frame in FIG. 1 in a resin layer formation process of the electro-optical device according to the first embodiment of the disclosure.
Figure 7A:
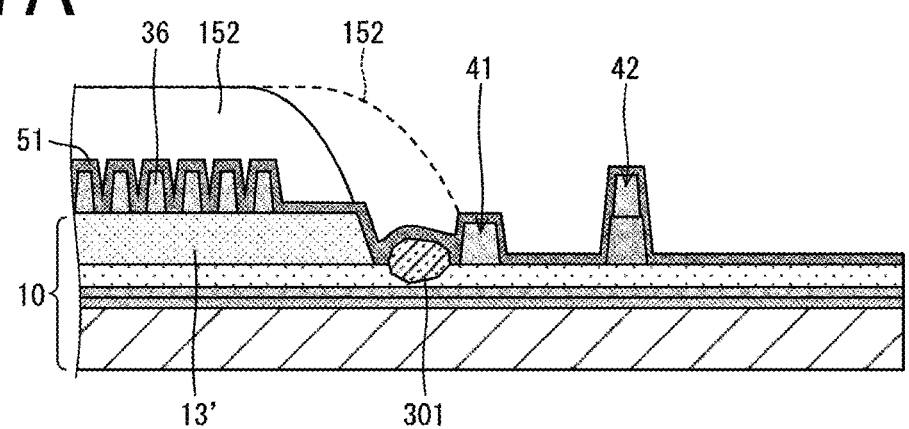
FIG. 7A is a cross-sectional view illustrating a problem of an electro-optical device for comparison using a flattening layer in which the edge does not include an uneven structure instead of the flattening layer in which the edge includes the uneven structure.
Figure 7B:
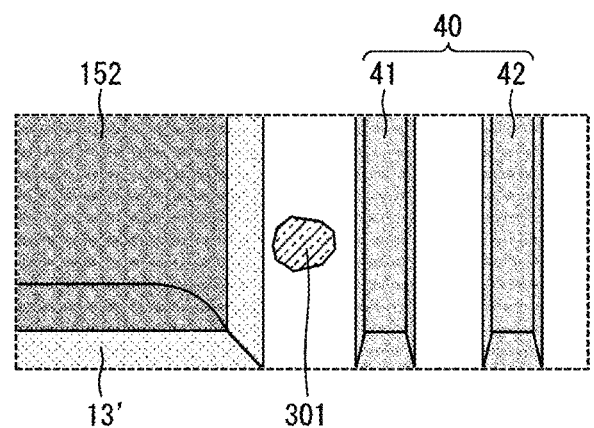
FIG. 7B is a plan view illustrating a schematic configuration of the vicinity of the edge of the flattening layer of the electro-optical device illustrated in FIG. 7A.

FIGS. 5A to 5E are cross-sectional views illustrating a process sequence in a manufacturing method of the electro-optical device 1 according to the present embodiment. FIG. 6 is a perspective view illustrating a schematic configuration of a region illustrated surrounded by the frame in FIG. 1 in a resin layer formation process of the electro-optical device 1 according to the present embodiment. FIG. 7A is a cross-sectional view illustrating a problem of an electro-optical device for comparison using a flattening layer 13' in which an edge does not include an uneven structure instead of the flattening layer 13 in which the edge includes the uneven structure. FIG. 7B is a plan view illustrating a schematic configuration of the vicinity of the edge of the flattening layer 13' of the electro-optical device illustrated in FIG. 7A. Note that, illustration of the first inorganic layer 51 is omitted in FIG. 6 and FIGS. 7A and 7B, for the convenience of illustration.

Figure 5A:
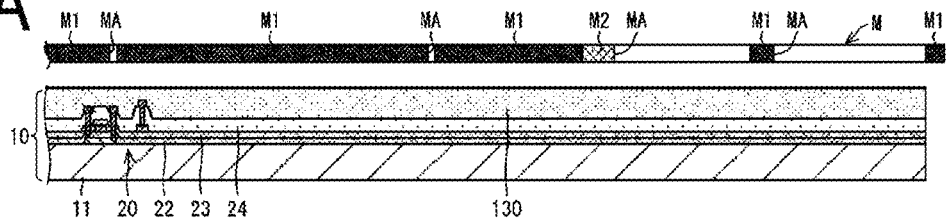
FIGS. 5A to 5E are cross-sectional views illustrating a process sequence in a manufacturing method of the electro-optical device according to the first embodiment of the disclosure.

First, as illustrated in FIG. 5A, the circuit substrate 10 is formed on the insulating substrate 11 (circuit substrate formation process). The circuit substrate formation process includes a driving element layer formation process and a flattening layer formation process.

Specifically, first, the TFT layer 12 including the circuit portion 20 including the TFT 25 and the plurality of wiring lines is formed, for example, as the driving element layer, on the insulating substrate 11 by a known method (driving element layer formation process). Afterwards, a photosensitive resin 130 is applied to the TFT layer 12 by a known method.

Subsequently, the flattening layer 13 formed by the photosensitive resin 130 and the lower layer bank 42a of the second bank 42 are pattern-formed by photolithography or the like (the flattening layer formation process including an unevenness formation process and a lower layer bank formation process).

In the present embodiment, a mask M (photomask) including openings MA, light blocking portions M1, and halftone portions M2 is used in the pattern forming.

FIG. 5A illustrates an example of a case in which the positive-working photosensitive resin 130 is used as the material of the flattening layer 13 and the lower layer bank 42a, for example.

The openings MA are provided facing regions except for formation regions of the flattening layer 13 and the lower layer bank 42a in the photosensitive resin 130 on the insulating substrate 11 and facing formation regions of the slit 13a and the contact hole 13b in the flattening layer 13. The light blocking portions M1 cover the formation region of the flattening layer 13, except for formation regions of the slit 13a, the contact hole 13b, and the uneven structure of the edge of the flattening layer 13, and cover the formation region of the lower layer bank 42a in the photosensitive resin 130. The halftone portions M2 cover the formation region of the uneven structure of the edge of the flattening layer 13 in the photosensitive resin 130.

When the photosensitive resin 130 is irradiated via the mask M with light such as UV light, the photosensitive resin 130 is irradiated with light transmitted by each of the openings MA and the halftone portions M2. As a result, in the photosensitive resin 130, regions facing the openings MA are exposed and regions facing the halftone portions M2 are half-exposed.

Figure 5B:
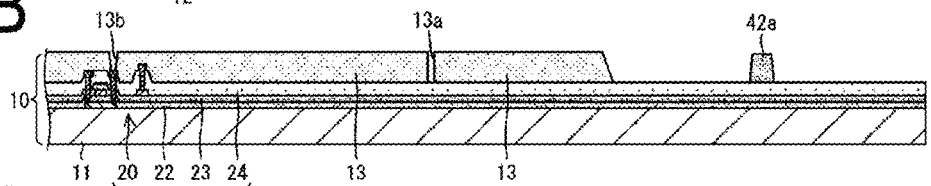

Afterwards, as illustrated in FIG. 5B, the flattening layer 13 and the lower layer bank 42*a* formed from the photosensitive resin 130 are simultaneously pattern-formed by performing developing.

At this time, depending on an interference of the light from half-exposure and a resolution of an exposure device, it is possible to form, on an edge of the flattening layer 13, for example, an uneven structure having a zig-zag structure such as illustrated in FIG. 1 and FIGS. 3A and 3B, by which an end face has a gentle inclination angle (unevenness formation process). In this way, the circuit substrate 10 according to the present embodiment is formed.

Note that each of the flattening layer 13 and the lower layer bank 42*a* may obviously be formed by etching, double exposure, or the like, and the flattening layer 13 and the lower layer bank 42*a* may be formed in different processes using masks different from each other.

Furthermore, when the electro-optical device 1 is a flexible device, first, a resin layer and a barrier layer are formed by film formation in this order on a light-transmitting carrier substrate (not illustrated) such as a glass substrate (for example, a mother glass). Afterwards, the TFT layer 12 and the flattening layer 13 are formed successively on the barrier layer as described above.

Figure 5C:
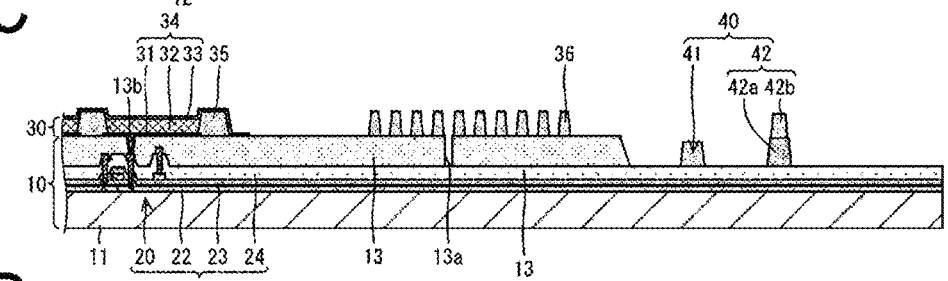

Subsequently, as illustrated in FIG. 5C, the OLED layer 30 including the OLED elements 34 is formed on the circuit substrate 10, as an electro-optical element layer including the electro-optical elements (electro-optical element formation process).

Note that the electro-optical element layer may be formed by a known method according to a type of the electro-optical element. For example, as described above, when the electro-optical elements are the OLED elements 34 and the electro-optical device 1 is a full-color organic EL display device, first, the first electrode 31 is pattern-formed to a matrix shape on the flattening layer 13 by a known method such as sputtering (first electrode formation process). Afterwards, an organic film (not illustrated) formed from, for example, a positive-working photosensitive resin such as an acrylic resin or a polyimide resin and the like, is formed on the circuit substrate 10 to cover the first electrode 31. Subsequently, the banks 35 and 36, the first bank 41, and an upper layer bank 42*b* in the second bank 42, all of which formed from the organic film, are pattern-formed by photolithography or the like (bank formation process). Next, the organic EL layer 32 that is a function layer including a light-emitting layer is deposited, for example, on each of the pixels 2 by separately patterning vapor deposition so that a light-emitting layer of each color covers a region surrounded by the bank 35 (function layer formation process). Note that, in the film formation of the organic EL layer 32, a method other than vapor deposition may be used, such as an ink-jet method or a printing method. Subsequently, the second electrode 33 is formed on the entire surface of the active region DA in the circuit substrate 10 so as to cover the organic EL layer 32 and the bank 35, and the second electrode 33 is electrically connected to the second electrode connecting wiring line of the second electrode connecting portion (second electrode formation process). As a result, the OLED element layer 30 including the OLED elements 34 can be formed on the circuit substrate 10 as the electro-optical element layer.

Note that the same material may obviously be used to simultaneously form the banks 35 and 36, the first bank 41, and the upper layer bank 42*b* in the second bank 42 in the same layer, or formation may be performed by different processes using materials different from each other or masks different from each other. In other words, an edge cover formation process of forming the bank 35 functioning as an edge cover; a first frame-shaped bank formation process of forming the frame-shaped banks 36; a second frame-shaped bank formation process of forming the first bank 41; and a third frame-shaped bank formation process of forming the second bank 42, in which the upper layer bank 42*b* is provided, may be performed simultaneously or may be performed at different timings by using, for example, masks (photomasks) different from each other. Note that, when these processes are performed at different timings, different materials can be used for each of the materials.

Subsequently, the OLED element layer 30 is sealed by the sealing film 50, as described above (sealing film formation process). The sealing film formation process includes a first inorganic layer formation process, a resin layer formation process, and a second inorganic layer formation process.

Figure 5D:
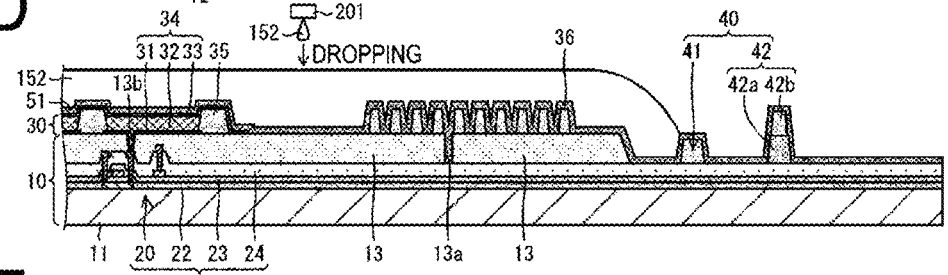

In the sealing film formation process, first, as illustrated in FIG. 5D, the first inorganic layer 51 formed by silicon nitride, silicon oxide, or the like is formed by chemical vapor deposition (CVD) or the like, over the entire surface of the active region DA and the non-active area NA, except for the terminal portion TM, on the circuit substrate 10 on which the OLED element layer 30 is formed (first inorganic layer formation process).

Subsequently, the ink material 152 that is the material of the resin layer 52 is applied by the ink-jet method or the like, to the entire surface of a region surrounded by the bank 35 (that is, the active region DA illustrated in FIG. 2) (resin dropping process in the resin layer formation process).

The ink material 152 can easily be stopped on the planar face. When the edge of the flattening layer 13' has a linear shape, such as in the electro-optical device for comparison illustrated in FIG. 7A, the ink material 152 remains on the edge of the upper face of the flattening layer 13, without running off and falling down from the upper face of the flattening layer 13, as illustrated by a solid line in FIG. 7A, due to the effect of the surface tension, until the action of gravity surpasses the action of the surface tension.

As illustrated by a dashed line in FIG. 7A, when the ink material 152 reaches the first bank 41, even when foreign matters 301 have infiltrated a region surrounded by the first bank 41, the foreign matters 301 can be covered and levelled by the resin layer 52 obtained from curing the ink material 152.

However, when the edge of the flattening layer 13' has the linear shape, as illustrated in FIGS. 7A and 7B, the ink material 152 is stopped at the edge of the flattening layer 13' and the flow movement of the ink material 152 tends to stop on the flattening layer 13', as illustrated by the solid line in FIG. 7A and as illustrated in FIG. 7B. When the flow movement of the ink material 152 stops on the flattening layer 13' and does not reach the first bank 41, a region is generated where the foreign matters 301 cannot be covered and levelled by the resin layer 52.

On the other hand, the uneven structure is provided at the edge of the flattening layer 13 of the electro-optical device 1 according to the present embodiment, and thus each edge (each side, each edge portion) of the flattening layer 13 is not formed as a continuous straight line from one end to the other end in a plan view. Therefore, portions connected by straight lines are shorter than those in the related art. According to the present embodiment, as illustrated in FIG. 5D, the ink material 152, dropped on the upper face of the flattening layer 13 from an ink-jet head 201 of an inkjet coating device, first reaches the recessed portions 131 and runs off from the recessed portions 131. When the ink material 152 runs off from the flattening layer 13 from any one location, the ink material 152 in the periphery, as a result, also runs off together from the flattening layer 13. The recessed portions 131 function as ink flow-inducing portions for inducing the flow movement of the ink material 152 down from the upper face of the flattening layer 13.

The ink material 152 flows, spreads, and becomes leveled in the active region DA. In addition, the ink material 152 runs off from the flattening layer 13, falls into an interval portion between the flattening layer 13 and the first bank 41, and spreads in the interval portion. Almost all of the ink material 152 that spreads into the interval portion is again stopped by the first bank 41.

Subsequently, the ink material 152 is irradiated with UV (ultraviolet) light to cure the ink material 152 (resin curing process in the resin layer formation process). As a result, the resin layer 52 composed of the ink material 152 is formed (resin layer formation process).

Figure 5E:
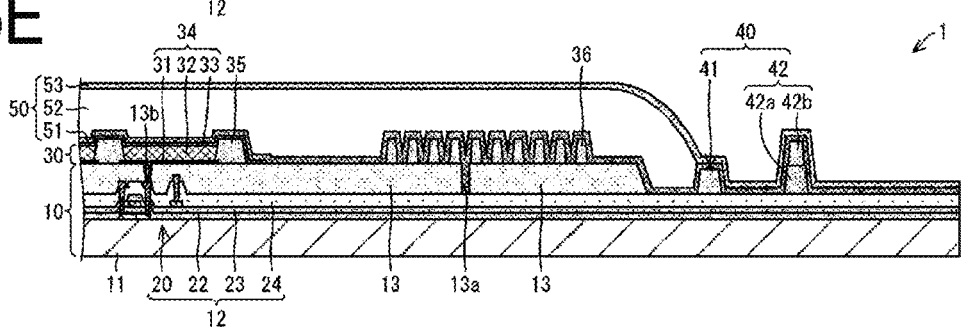

Subsequently, as illustrated in FIG. 5E, an inorganic insulating film, formed from a silicon nitride, a silicon oxide, or the like, is formed by CVD or the like on the first inorganic layer 51 to cover the resin layer 52. As a result, the second inorganic layer 53 is formed on the entire surface of the active region DA and the non-active area NA, except for the terminal portion TM.

In this way, the sealing film 50 composed of the first inorganic layer 51, the resin layer 52, and the second inorganic layer 53 is formed. Note that, when the electro-optical device 1 is a flexible device, a protection film or the like is attached to the sealing film 50 after the sealing film formation process, and the carrier substrate mentioned above is peeled off by ablation at an interface between the carrier substrate and the resin layer by performing laser irradiation. Afterwards, after attaching a lower face film to a peeling face of the carrier substrate, the singulation of the electro-optical device 1 is performed, as necessary.

After that, as necessary, a functional film such as a polarizing film and a touch sensor film; or a cover body such as a polarizing plate and a touch panel are attached.

Advantageous Effects

According to the present embodiment, as described above, the uneven structure is provided on the edge of the flattening layer 13, and thus the ink material 152 easily spreads and reaches the first bank 41. Therefore, according to the present embodiment, as illustrated in FIGS. 7A and 7B, even when the foreign matters 301 have infiltrated a region surrounded by the first bank 41, the foreign matters 301 can be surely covered by the resin layer 52, and a reduction in the reliability as a result of insufficient covering of the foreign matters 301 can be prevented.

First Modified Example

Figure 8A:
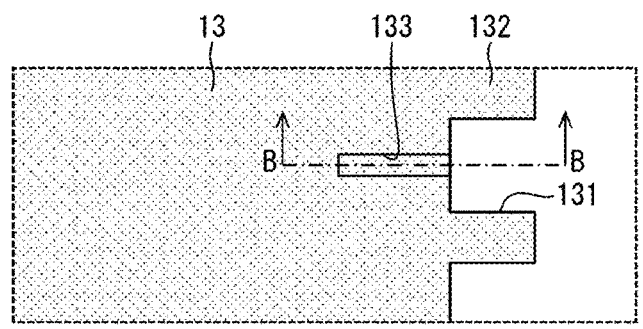
FIGS. 8A and 8B are plan views further illustrating another example of the uneven structure of the edge of the flattening layer in main portions of the electro-optical device according to the first embodiment of the disclosure.
Figure 8B:
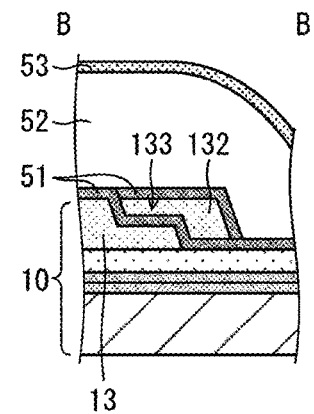

FIG. 8A is a plan view further illustrating another example of the uneven structure of the edge of the flattening layer 13 in main portions of the electro-optical device 1 according to the present first embodiment. FIG. 8B is a cross-sectional view along arrows on a line B-B in the electro-optical device 1 illustrated in FIG. 8A. Note that, the illustration of portions other than the flattening layer 13 is omitted in FIG. 8A, for the convenience of illustration.

As illustrated in FIGS. 8A and 8B, a groove 133 recessed in a thickness direction of the flattening layer 13 and extending inwardly from the recessed portions 131 in a plan view may be provided on the upper face of the flattening layer 13. As illustrated in FIG. 8B, the groove 133 includes a base composed of the flattening layer 13, and the recessed portions 131 may be formed in a stepped shape in a cross-sectional view.

However, the present embodiment is not limited thereto, and the groove 133 may include a base composed of an underlayer of the flattening layer 13 (in the present embodiment, the inorganic insulating layer 24), and the recessed portions 131 may be formed in a stepped shape in a plan view. In other words, at least one groove 133 may further be formed in each of the recessed portions 131 in the flattening layer 13, and the flattening layer 13 may include step-shaped recessed portions.

In the unevenness formation process of the flattening layer formation process, the groove 133 can be formed simultaneously with the recessed portions 131 and the protruding portions 132. For example, the groove 133, the recessed portions 131, and the protruding portions 132 may be formed simultaneously by forming, in the mask M, the halftone portion (not illustrated) corresponding to the groove 133 and having a different light transmittance than the halftone portions M2. Furthermore, after exposing the photosensitive resin 130 by using the mask M in which the halftone portions M2 are provided, the groove 133, the recessed portions 131, and the protruding portions 132 may be formed simultaneously, with the use of a single-purpose mask in which an opening for forming the groove 133 is provided, by performing exposure in which an amount of exposure is changed from the exposure using the mask M and by performing developing afterwards.

However, as long as a groove formation process of forming the groove 133 is performed at least before the resin layer formation process in the sealing film formation process, a groove formation process of forming the groove 133 may be performed simultaneously to the unevenness formation process, as described above, or may be performed separately after the unevenness formation process by photolithography or the like.

By forming the groove 133 in the edge of the flattening layer 13, the number of step portions in the edge of the flattening layer 13 in a plan view that function as ink flow-inducing portions can be increased. Thus, the ink material 152 can more easily run off and drop down from the flattening layer 13, and the ink material 152 reaches the first bank 41 easily and more surely.

Second Modified Example

Note that, as described above, in the present embodiment, an organic EL display device including the OLED elements 34 as the electro-optical elements, is described as an example, as one example of the electro-optical device 1 according to the present embodiment. However, the electro-optical device 1 according to the present embodiment is not limited thereto. Examples of the electro-optical element include, for example, an electro-optical element in which luminance and transmittance are controlled by an electric current, an electro-optical element in which luminance and transmittance are controlled by voltage, and the like.

Examples of the electro-optical device including the electro-optical element controlled by the electric current include, for example, an organic electro luminescence (EL) display including an organic light emitting diode (OLED) element, an EL display such as an inorganic EL display including an inorganic light emitting diode element (inorganic EL element), or a QLED display including a quantum-dot light emitting diode (QLED) element. Furthermore, the electro-optical element controlled by voltage can be, for example, a liquid crystal display element or the like.

Furthermore, the electro-optical device 1 according to the present embodiment is not limited to image display devices and can be suitably used in illumination devices, integrated circuit (IC) tags, IC cards, electronic paper, and the like. Furthermore, the electro-optical device 1 may include only one electro-optical element, according to the use of the electro-optical device 1. That is, the electro-optical device 1 may include at least one electro-optical element.

Second Embodiment

Another aspect of the disclosure will be described below by referring mainly to FIGS. 9A and 9B and FIG. 10. The present embodiment will be described in terms of the differences between the present embodiment and the first embodiment, and components having the same function as the components described in the first embodiment are assigned the same reference signs, and a description thereof is omitted. Furthermore, the same modifications as those of the first embodiment can also be applied to the present embodiment.

Schematic Configuration of Electro-Optical Device 1

Figure 9A:
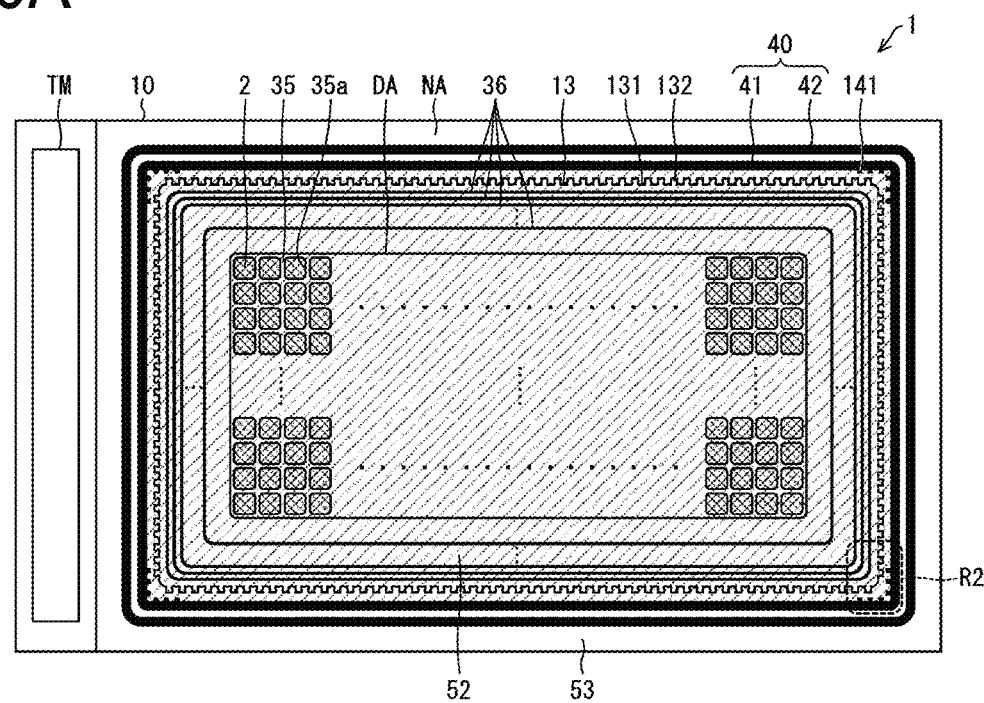
FIG. 9A is a plan view illustrating a schematic configuration of main portions of an electro-optical device according to a second embodiment of the disclosure.

FIG. 9A is a plan view illustrating a schematic configuration of main portions of the electro-optical device 1 according to the present embodiment. FIG. 9B is a plan view illustrating a schematic configuration of a region R2 illustrated surrounded by a frame in FIG. 9A. Furthermore, FIG. 10 is another plan view illustrating a schematic configuration of main portions of the electro-optical device 1 according to the present embodiment.

Figure 9B:
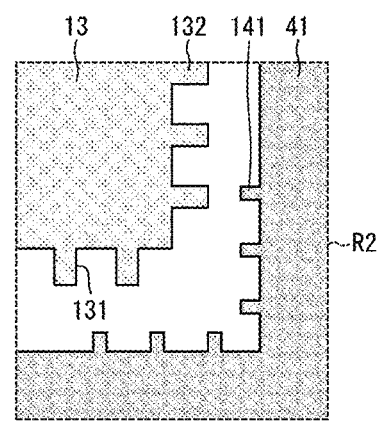
FIG. 9B is a plan view illustrating a schematic configuration of a region illustrated surrounded by a frame in FIG. 9A.
Figure 10:
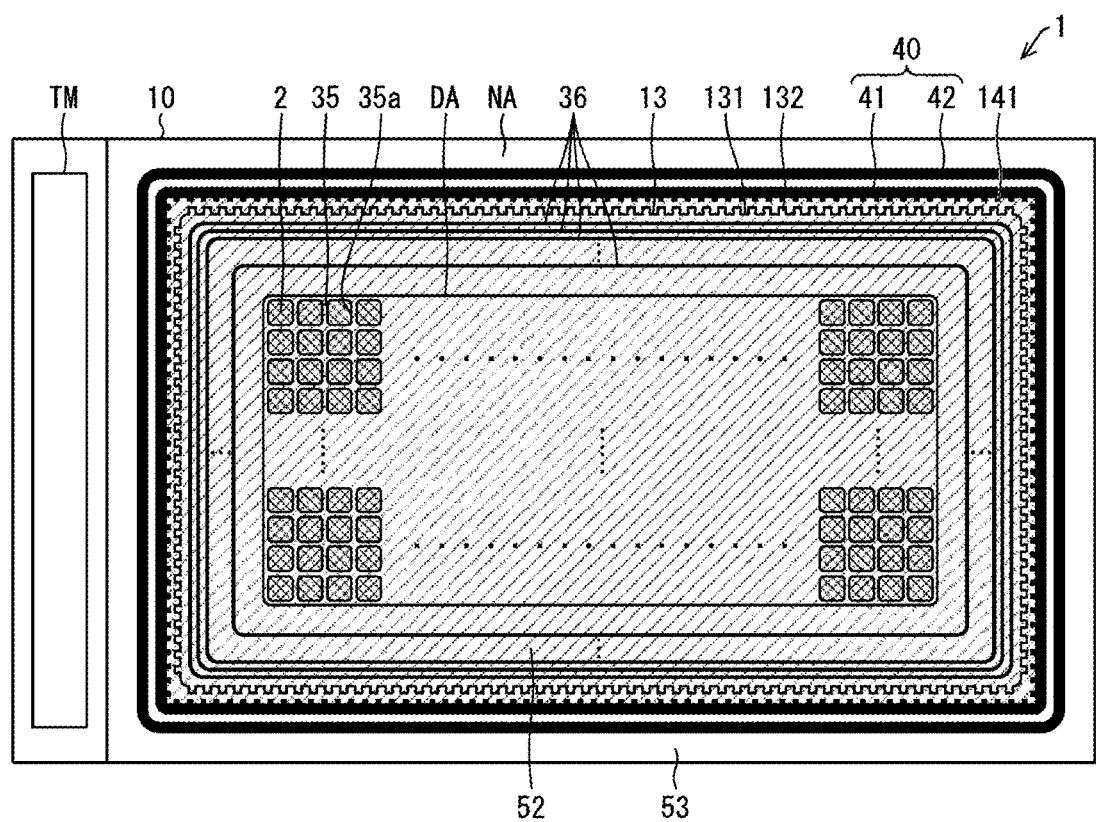
FIG. 10 is another plan view illustrating a schematic configuration of main portions of the electro-optical device according to the second embodiment of the disclosure.

As illustrated in FIGS. 9A and 9B and FIG. 10, the electro-optical device 1 according to the present embodiment is the same as the electro-optical device 1 according to the first embodiment, except from the point that protruding portions 141 are provided on a side of the first bank 41 facing the flattening layer 13.

Note that, in FIGS. 9A and 9B and FIG. 10, as one example, an example of a case is illustrated in which the comb-shaped uneven structure (rectangular wave shape), in which each of the recessed portions 131 and the protruding portions 132 has rectangular shapes, is provided on the flattening layer 13, as illustrated in FIG. 4A. However, the shape of the uneven structure is not limited thereto, as mentioned above.

Furthermore, in FIGS. 9A and 9B and FIG. 10, as one example, an example of a case is illustrated in which the four corners of each of the active region DA, the flattening layer 13, the banks 35 and 36, the first bank 41, and the second bank 42 have angle portions formed as right angles. However, as mentioned above, the four corners (in other words, each angle portion) of the active region DA, the flattening layer 13, the banks 35 and 36, the first bank 41, and the second bank 42 may also be curved.

Even though depending on a combination of conditions, such as the shape of the flattening layer 13, the shape of the first bank 41, the distance between the flattening layer 13 and the first bank 41, and the viscosity of the ink material 152 (refer to FIG. 5D and FIG. 6), the ink material 152 does not sufficiently spread between the four corners of the flattening layer 13 and the four corners of the first bank 41, and a gap is easily formed between the ink material 152 and the ink material 152. In particular, when each of the angle portions of the flattening layer 13 and the first bank 41 forms a right angle, a direct distance from each angle portion of the flattening layer 13 to the inner wall of the first bank 41 becomes longer between the four corners of the flattening layer 13 and the four corners of the first bank 41. Thus, the gap between the ink material 152 and the ink material 152 easily occurs between the four corners of the flattening layer 13 and the four corners of the first bank 41, and there is a concern that a region not covered by the resin layer 52 is produced.

However, as illustrated in FIGS. 9A and 9B and FIG. 10, the protruding portions 141 protruding toward the flattening layer 13 are provided on the side of the first bank 41 facing the flattening layer 13, and thus the width of the interval portion between the flattening layer 13 and the first bank 41 is small in a region where the protruding portions 141 are provided, and contact between the ink material 152 flowing through the interval portion is easily possible due to the protruding portions 141 changing a path and the like of the ink material 152 having reached the protruding portions 141. Therefore, the ink material 152 can easily wet-spread over the entire interval portion, and the entire interval portion can be surely covered by the resin layer 52. Furthermore, in the region where the protruding portions 141 are provided, the width of the first bank 41 widens, and thus the ink material 152 is not likely to overflow the first bank 41.

Therefore, as illustrated in FIGS. 9A and 9B, it is desirable that the protruding portions 141 are provided in the four corners (on an inner side of each angle portion) of the first bank 41. Note that, when the protruding portions 141 are provided at least in the four corners of the first bank 41, the protruding portions 141 may be provided in a portion other than the four corners in the first bank 41, and the protruding portions 141 may be provided over the entire circumference of the side facing the flattening layer 13, as illustrated in FIG. 10.

Furthermore, in the present embodiment, similarly to the first embodiment, an example of a case is described in which the outer shapes of the flattening layer 13 and the first bank 41 are rectangular shapes. However, when the flattening layer 13 and the first bank 41 have a shape having at least one angle portion (for example, an irregular shape or a triangular shape or a higher polygonal shape, having at least one angle portion) in a plan view, a similar effect to the effect described above can be obtained by providing the protruding portions 141 on an inner side (the side facing the flattening layer 13) of the angle portions of the first bank 41.

Furthermore, in FIGS. 9A and 9B and FIG. 10, an example of a case is illustrated in which the protruding portions 141 have a rectangular shape in a plan view and in which the comb-shaped unevenness (rectangular wave shape) including the protruding portions 141 is provided on the side of the first bank 41 facing the flattening layer 13 in a plan view. However, the shape of the protruding portions 141 is not limited to the shape described above and, similarly to the protruding portions 132, may be a triangular shape or a higher polygonal shape or a part thereof, or the shape of the protruding portions 141 may be a curved shape (circular arc shape). Thus, on the side of the first bank 41 facing the flattening layer 13, a curved, wave-shaped unevenness, such as a zig-zag shape (triangular wave shape) or a sine wave shape including the protruding portions 141, may be provided, or an unevenness including the protruding portions 141 formed by a polygonal shape or a part of a polygonal shape may be provided.

Furthermore, the protruding portions 132 and the protruding portions 141 may be provided facing each other or may be provided alternately.

Third Embodiment

Another aspect of the disclosure will be described below by referring mainly to FIGS. 11A and 11B and FIG. 12. The present embodiment will be described in terms of the differences between the present embodiment and the first and second embodiments, components having the same function as the components described in the first and second embodiments are assigned the same reference signs, and a description thereof is omitted. Furthermore, the same modifications as those of the first and second embodiments can also be applied to the present embodiment.

Schematic Configuration of Electro-Optical Device 1

Figure 11A:
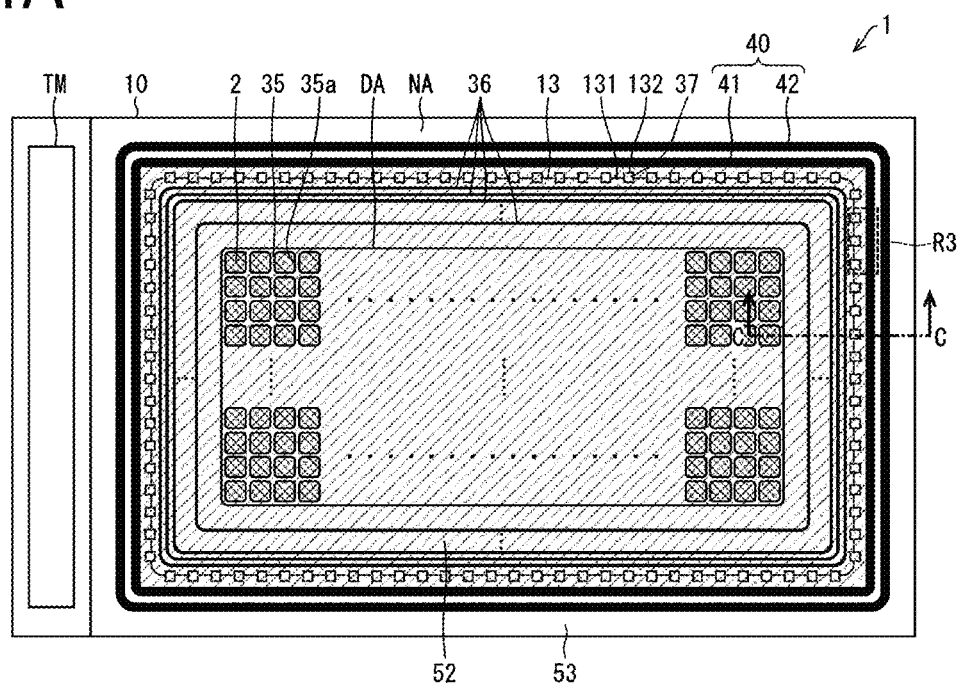
FIG. 11A is a plan view illustrating a schematic configuration of main portions of an electro-optical device according to a third embodiment of the disclosure.
Figure 11B:
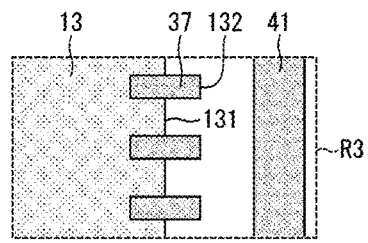
FIG. 11B is a plan view illustrating a schematic configuration of a region illustrated surrounded by a frame in FIG. 11A.
Figure 12:
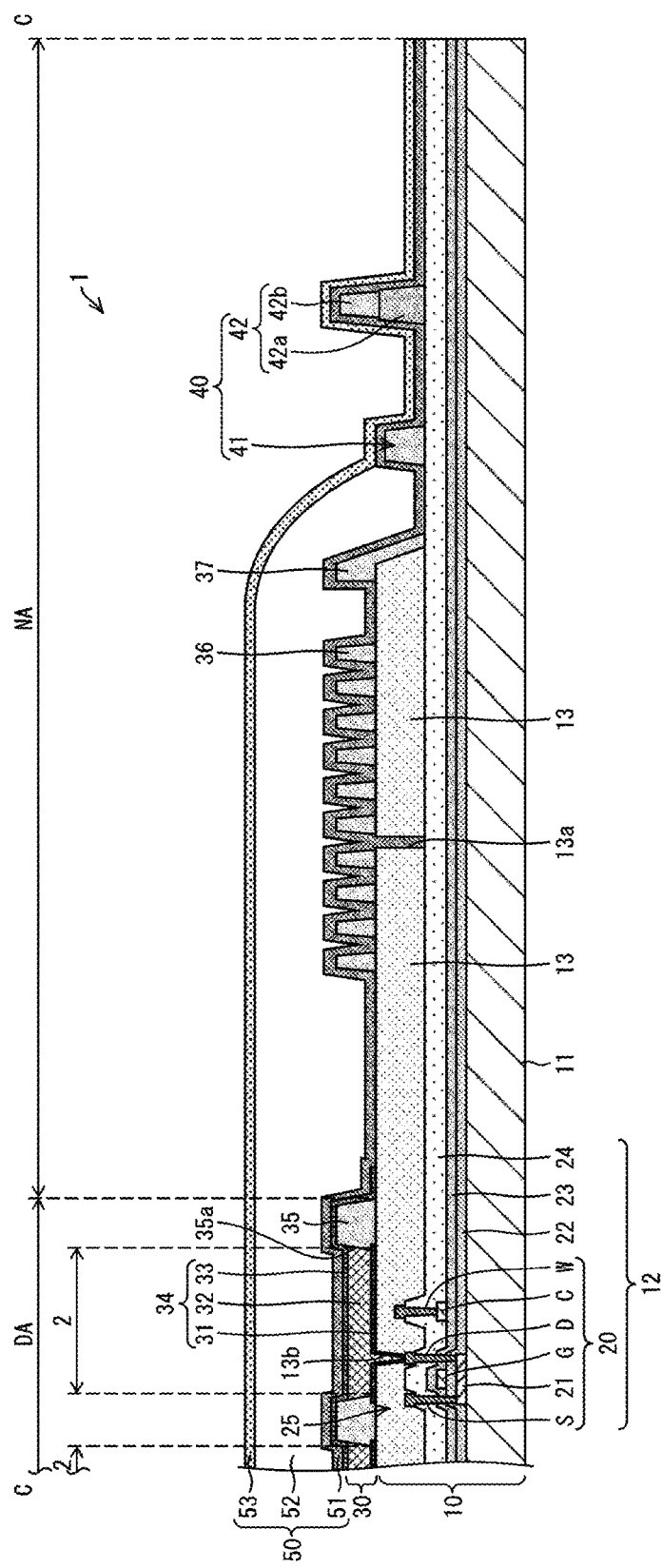
FIG. 12 is a cross-sectional view illustrating a schematic configuration of main portions of the electro-optical device according to the third embodiment of the disclosure.

FIG. 11A is a plan view illustrating a schematic configuration of main portions of the electro-optical device 1 according to the present embodiment. FIG. 11B is a plan view illustrating a schematic configuration of a region R3 illustrated surrounded by a frame in FIG. 11A. Furthermore, FIG. 12 is a cross-sectional view illustrating a schematic configuration of main portions of the electro-optical device 1 according to the present embodiment. Note that FIG. 12 corresponds to a cross-sectional view along arrows on a line C-C in the electro-optical device 1 illustrated in FIG. 11A.

The electro-optical device 1 according to the present embodiment is the same as the electro-optical device 1 according to the first and second embodiments, except from a point described below. In the electro-optical device 1 according to the present embodiment, instead of providing, on the flattening layer 13, the uneven structure facing the first bank 41, a plurality of island-shaped (strip-shaped) resin layers covering the flattening layer 13 as banks 37, from an upper face to an end face of a peripheral edge of the flattening layer 13 in a plan view, are formed intermittently to form the uneven structure on the peripheral edge of the flattening layer 13, as illustrated in FIGS. 11A and 11B and FIG. 12.

In the present embodiment, in a plan view, peripheral edges of the flattening layer 13 not covered by the banks 37 form the recessed portions 131, and leading ends of the banks 37 protruding toward the first bank 41 form the protruding portions 132. As a result, the uneven structure composed of the recessed portions 131 and the protruding portions 132 is formed on the peripheral edge of the flattening layer 13 in a plan view.

The banks 37, the bank 35 (edge cover), the banks 36, the first bank 41, and the upper layer bank 42b in the second bank 42 can be formed simultaneously in the same layer by using the same material. In other words, the unevenness formation process according to the present embodiment can be performed simultaneously to the bank formation processes (the edge cover formation process, the first frame-shaped bank formation process, the second frame-shaped bank formation process, and the third frame-shaped bank formation process).

However, as mentioned above, the edge cover formation process, the first frame-shaped bank formation process, the second frame-shaped bank formation process, and the third frame-shaped bank formation process may each be performed at a different timing by using different masks (photomasks) and different materials.

Thus, as long as the unevenness formation process is performed at least before the resin layer formation process in the sealing film formation process, the unevenness formation process may be performed simultaneously with at least one of the bank formation processes (for example, the edge cover formation process) or may be performed at a different timing from the bank formation processes.

In the present embodiment, the uneven structure is provided at the edge of the flattening layer 13, and thus each edge (each side, each edge portion) of the flattening layer 13 is not formed as a continuous straight line from one end to the other end in a plan view. Therefore, portions connected by straight lines are shorter than those in the related art. Furthermore, the banks 37 are provided from the upper face to the end face of the peripheral edge of the flattening layer 13, and thus the ink material 152 colliding with the banks 37 easily runs off along the banks 37 and falls down from the flattening layer 13. Accordingly, the present embodiment can also obtain similar advantageous effects to those of the first embodiment.

Supplement

An electro-optical device (1) according to a first aspect of the disclosure includes a circuit substrate (10) including a flattening layer (13) provided on a surface of the circuit substrate, at least one electro-optical element (for example, an OLED element 34) provided on the flattening layer, a sealing film (50) sealing the electro-optical element and including at least a resin layer (52), and a frame-shaped bank (a first bank 41) surrounding the flattening layer and covered by the resin layer on an inner side, and, in a plan view, an unevenness (an unevenness including recessed portions 131 and protruding portions 132) is provided at a peripheral edge of the flattening layer facing the frame-shaped bank.

In an electro-optical device according to a second aspect of the disclosure, in the first aspect, the flattening layer may be pattern-formed, and the peripheral edge includes the unevenness in a plan view.

In an electro-optical device according to a third aspect of the disclosure, in the second aspect, a groove (133) recessed in a thickness direction of the flattening layer and extending inwardly from a recessed portion (131) of the unevenness in a plan view may be provided on an upper face of the flattening layer.

In an electro-optical device according to a fourth aspect of the disclosure, the unevenness in the second aspect may have a zig-zag shape in a plan view.

In an electro-optical device according to a fifth aspect of the disclosure, in the first aspect, the at least one electro-optical element may include a pattern electrode (first electrode 31) provided for each of the at least one electro-optical element, a peripheral edge of the pattern electrode may be covered by an edge cover (bank 35) including an opening configured to expose a part of the pattern electrode, and a plurality of island-shaped resin layers (bank 37), formed from a same material as the edge cover, provided in a same layer as the edge cover and covering the flattening layer from an upper face to an end face of the peripheral edge of the flattening layer, may be formed intermittently in a plan view, a peripheral edge of the flattening layer not covered by the plurality of island-shaped resin layers forms a recessed portion (131), a leading end of the plurality of island-shaped resin layers protruding toward the frame-shaped bank forms a protruding portion (132), and the unevenness including the recessed portion and the protruding portion is formed at the peripheral edge in a plan view.

In an electro-optical device according to a sixth aspect of the disclosure, in any of the first to fifth aspects, a plurality of protruding portions (141) protruding toward the flattening layer, may be provided on a side of the frame-shaped bank facing the flattening layer.

In an electro-optical device according to a seventh aspect of the disclosure, in the sixth aspect, each of the flattening layer and the frame-shaped bank may have an outer shape of a shape including at least one angle portion (for example, a rectangular shape and the like, or a triangular or a higher polygonal shape), and the plurality of protruding portions (141) may be provided on an inner side of the angle portion in the frame-shaped bank.

In an electro-optical device according to an eighth aspect of the disclosure, in the sixth aspect, the plurality of protruding portions (141) surrounding the flattening layer may be provided on the frame-shaped bank.

A manufacturing method of an electro-optical device according to a ninth aspect of the disclosure is a manufacturing method of an electro-optical device including a circuit substrate (10) including a flattening layer (13) provided on a surface of the circuit substrate, at least one electro-optical element (for example, an OLED element 34) provided on the flattening layer, a sealing film (50) sealing the electro-optical element and including at least a resin layer (52), and a frame-shaped bank (first bank 41) surrounding the flattening layer and covered by the resin layer on an inner side of the frame-shaped bank, the manufacturing method including forming an unevenness (an unevenness including recessed portions 131 and protruding portions 132) in a plan view at a peripheral edge of the flattening layer, forming the frame-shaped bank surrounding the flattening layer (a second frame-shaped bank formation process), and forming the resin layer covering an inner side of the frame-shaped bank, and the forming the resin layer includes dropping a liquid resin (ink material 152) on the flattening layer.

In a manufacturing method of an electro-optical device according to a tenth aspect of the disclosure, in the ninth aspect, in the forming the unevenness, the flattening layer may be pattern-formed such that the peripheral edge includes the unevenness in a plan view.

A manufacturing method of an electro-optical device according to an eleventh aspect of the disclosure may include, in the ninth aspect, forming, on an upper face of the flattening layer, at least before the forming the resin layer, a groove (133) recessed in a thickness direction of the flattening layer and extending inwardly from a recessed portion (131) of the unevenness in a plan view.

In a manufacturing method of the electro-optical device according to a twelfth aspect of the disclosure, in the tenth aspect, in the forming the unevenness, the flattening layer may be pattern-formed such that the peripheral edge of the flattening layer includes the unevenness having a zig-zag shape.

In a manufacturing method of an electro-optical device according to a thirteenth aspect of the disclosure, the manufacturing method of an electro-optical device in the ninth aspect may further include forming the at least one electro-optical element on the flattening layer, the forming the electro-optical element may include forming a pattern electrode (first electrode 31) for each electro-optical element and forming an edge cover (bank 35) covering a peripheral edge of the pattern electrode and including an opening configured to expose a part of the pattern electrode, among the forming the unevenness, the forming the edge cover, and the forming the frame-shaped bank, at least the forming the unevenness and the forming the edge cover may be performed simultaneously, in the forming the unevenness, a plurality of island-shaped resin layers (banks 37) formed from a same material as the edge cover, provided in a same layer as the edge cover, and covering the flattening layer from an upper face to an end face of the peripheral edge of the flattening layer, may be formed intermittently such that, in a plan view, the peripheral edge of the flattening layer not covered by the plurality of island-shaped resin layers forms a recessed portion (131), a leading end of the plurality of island-shaped resin layers protruding toward the frame-shaped bank forms a protruding portion (132), and the unevenness including the recessed portion and the protruding portion is formed at the peripheral edge in a plan view.

In a manufacturing method of an electro-optical device according to a fourteenth aspect of the disclosure, in the forming the frame-shaped bank in any of the ninth to thirteenth aspects, a plurality of protruding portions (141) protruding toward the flattening layer may be formed on a side of the frame-shaped bank facing the flattening layer.

In a manufacturing method of an electro-optical device according to a fifteenth aspect of the disclosure, in the forming the frame-shaped bank in the fourteenth aspect, the frame-shaped bank may be formed such that the frame-shaped bank has an outer shape of a shape including at least one angle portion (for example, a rectangular shape and the like, or a triangular or a higher polygonal shape), and the plurality of protruding portions (141) are provided on an inner side of the angle portion in the frame-shaped bank.

In a manufacturing method of the electro-optical device according to a sixteenth aspect of the disclosure, in the forming the frame-shaped bank in the fourteenth aspect, the frame-shaped bank may be formed such that the plurality of protruding portions (141) surround the flattening layer.

The disclosure is not limited to each of the embodiments stated above, and various modifications may be implemented within a range not departing from the scope of the claims. Embodiments obtained by appropriately combining technical approaches stated in each of the different embodiments also fall within the scope of the technology of the disclosure. Moreover, novel technical features may be formed by combining the technical approaches stated in each of the embodiments.

REFERENCE SIGNS LIST

1 Electro-optical device
10 Circuit substrate
13 Flattening layer
31 First electrode (Pattern electrode)
34 OLED element
35 Bank (Edge cover)
37 Bank (Island-shaped resin layer)
41 First bank (Frame-shaped bank)
50 Sealing film
52 Resin layer
131 Recessed portion
132, 141 Protruding portion
133 Groove
152 Ink material (Liquid resin)

The invention claimed is:
1. An electro-optical device, comprising:
a circuit substrate including a flattening layer provided on a surface of the circuit substrate;
at least one electro-optical element provided on the flattening layer;
a sealing film sealing the electro-optical element and including at least a resin layer; and a frame-shaped bank surrounding the flattening layer and covered by the resin layer on an inner side of the frame-shaped bank,
wherein, in a plan view, an unevenness is provided at a peripheral edge of the flattening layer facing the frame-shaped bank.

2. The electro-optical device according to claim 1, wherein the flattening layer is pattern-formed, and the peripheral edge has the unevenness in a plan view.

3. The electro-optical device according to claim 2, wherein a groove recessed in a thickness direction of the flattening layer and extending inwardly from a recessed portion of the unevenness in a plan view is provided on an upper face of the flattening layer.

4. The electro-optical device according to claim 2, wherein the unevenness has a zig-zag shape in a plan view.

5. The electro-optical device according to claim 1, wherein the at least one electro-optical element includes a pattern electrode provided for each of the at least one electro-optical element,
a peripheral edge of the pattern electrode is covered by an edge cover including an opening configured to expose a part of the pattern electrode, and
a plurality of island-shaped resin layers, formed from a same material as the edge cover, provided in a same layer as the edge cover, and covering the flattening layer from an upper face to an end face of the peripheral edge of the flattening layer, are formed intermittently in a plan view, a peripheral edge of the flattening layer not covered by the plurality of island-shaped resin layers forms a recessed portion, a leading end of the plurality of island-shaped resin layers protruding toward the frame-shaped bank forms a protruding portion, and the unevenness including the recessed portion and the protruding portion is formed at the peripheral edge in a plan view.

6. The electro-optical device according to claim 1, wherein a plurality of protruding portions protruding toward the flattening layer are provided on a side of the frame-shaped bank facing the flattening layer.

7. The electro-optical device according to claim 6, wherein each of the flattening layer and the frame-shaped bank has an outer shape of a shape including at least one angle portion, and the plurality of protruding portions are provided on an inner side of the angle portion in the frame-shaped bank.

8. The electro-optical device according to claim 6, wherein the plurality of protruding portions surrounding the flattening layer are provided on the frame-shaped bank.

9. A manufacturing method of an electro-optical device including a circuit substrate including a flattening layer provided on a surface of the circuit substrate, at least one electro-optical element provided on the flattening layer, a sealing film sealing the electro-optical element and including at least a resin layer, and a frame-shaped bank surrounding the flattening layer and covered by the resin layer on an inner side of the frame-shaped bank, the manufacturing method comprising:
forming an unevenness in a plan view at a peripheral edge of the flattening layer;
forming the frame-shaped bank surrounding the flattening layer; and
forming the resin layer covering an inner side of the frame-shaped bank,
wherein the forming the resin layer includes dropping a liquid resin on the flattening layer.

10. The manufacturing method of an electro-optical device according to claim 9,
wherein, in the forming the unevenness, the flattening layer is pattern-formed such that the peripheral edge includes the unevenness in a plan view.

11. The manufacturing method of an electro-optical device according to claim 9, further comprising:
forming, on an upper face of the flattening layer, at least before the forming the resin layer, a groove recessed in a thickness direction of the flattening layer and extending inwardly from a recessed portion of the unevenness in a plan view.

12. The manufacturing method of an electro-optical device according to claim 10,
wherein, in the forming the unevenness, the flattening layer is pattern-formed such that the peripheral edge of the flattening layer includes the unevenness having a zig-zag shape.

13. The manufacturing method of an electro-optical device according to claim 9, further comprising:
forming the at least one electro-optical element on the flattening layer,
wherein the forming the electro-optical element includes
forming a pattern electrode for each electro-optical element, and
forming an edge cover covering a peripheral edge of the pattern electrode and including an opening configured to expose a part of the pattern electrode,
among the forming the unevenness, the forming the edge cover, and the forming the frame-shaped bank, at least the forming the unevenness and the forming the edge cover are performed simultaneously,
in the forming the unevenness, a plurality of island-shaped resin layers formed from a same material as the edge cover, provided in a same layer as the edge cover, and covering the flattening layer from an upper face to an end face of the peripheral edge of the flattening layer, are formed intermittently such that, in a plan view, the peripheral edge of the flattening layer not covered by the plurality of island-shaped resin layers forms a recessed portion, a leading end of the plurality of island-shaped resin layers protruding toward the frame-shaped bank forms a protruding portion, and the unevenness including the recessed portion and the protruding portion is formed at the peripheral edge in a plan view.

14. The manufacturing method of an electro-optical device according to claim 9,
wherein, in the forming the frame-shaped bank, a plurality of protruding portions protruding toward the flattening layer are formed on a side of the frame-shaped bank facing the flattening layer.

15. The manufacturing method of an electro-optical device according to claim 14,
wherein, in the forming the frame-shaped bank, the frame-shaped bank is formed such that the frame-shaped bank has an outer shape of a shape including at least one angle portion, and the plurality of protruding portions are provided on an inner side of the angle portion in the frame-shaped bank.

16. The manufacturing method of an electro-optical device according to claim 14, wherein, in the forming the frame-shaped bank, the frame-shaped bank is formed such that the plurality of protruding portions surround the flattening layer.

* * * * *